United States Patent [19]

Rigg

[11] Patent Number: 4,922,196

[45] Date of Patent: May 1, 1990

[54] BEAM-BLANKING APPARATUS FOR STROBOSCOPIC ELECTRON BEAM INSTRUMENTS

[75] Inventor: Philip R. Rigg, Mountain View, Calif.

[73] Assignee: Amray, Inc., Bedford, Mass.

[21] Appl. No.: 342,629

[22] Filed: Apr. 19, 1989

Related U.S. Application Data

[63] Continuation of Ser. No. 240,427, Sep. 2, 1988, abandoned, which is a continuation of Ser. No. 129,859, Dec. 4, 1987, abandoned, which is a continuation of Ser. No. 857,720, Mar. 10, 1986, abandoned.

[51] Int. Cl.⁵ .................. G01R 1/00; G01R 31/02
[52] U.S. Cl. ..................... 324/158 R; 250/396 R; 324/71.3
[58] Field of Search .............. 313/426, 432, 439; 324/71.3, 158 R, 78 R; 250/310, 311, 396 R, 492, 492.2; 315/384, 385

[56] References Cited

U.S. PATENT DOCUMENTS

| | | | |
|---|---|---|---|
| 4,005,408 | 1/1977 | Taylor et al. | 340/347 P |
| 4,110,623 | 8/1978 | Azam et al. | 250/398 |
| 4,151,417 | 4/1979 | Takigawa | 250/396 R |
| 4,169,229 | 9/1979 | Feuerbaum | 250/396 R |
| 4,434,371 | 2/1984 | Knaber | 250/396 R |
| 4,445,041 | 4/1984 | Kelly et al. | 250/396 R |
| 4,507,586 | 3/1985 | Correll | 313/421 |
| 4,626,690 | 12/1986 | Tokodoro et al. | 250/396 R |
| 4,692,579 | 9/1987 | Saitou et al. | 250/492.2 |

FOREIGN PATENT DOCUMENTS

| | | | |
|---|---|---|---|
| 0110045 | 8/1980 | Japan | 250/396 R |
| 0165032 | 8/1985 | Japan | 250/396 R |

OTHER PUBLICATIONS

"Gigahertz Stroboscopy with the Scanning Electron Microscope", by Hosokawa et al., Rev. of Sci. Inst., vol. 49, #2, 9/78, pp. 1293-1299.

"On Wafer Analysis of LSI-MOS Memory Circuit by Scanning Electron Microscopy", by Lindner et al., Siemens Forsch.-Ent., vol. 6, #1, pp. 39-46, 1/77.

"Shaping Trigger Pulses from Noisy Signals and Fine-Resolved TEM of Fast Phase Transitions", by Bostanjoglo et al., Optik, vol. 61, #1, 4/82, pp. 91-98.

*Primary Examiner*—Reinhard J. Eisenzopf
*Assistant Examiner*—W. Burns
*Attorney, Agent, or Firm*—Nutter, McClennen & Fish

[57] ABSTRACT

An electron-beam scanning device (10) includes two pairs of plates (22 and 24, 64 and 66) that are oriented at right angles to each other. The plates cause electric fields oriented at right angles in a deflection region (68) through which an electron beam passes. Each pair of plates comprises the inner conductor and one of the outer conductors of a stripline section that conducts a deflection signal. The stripline section is matched in characteristic impedance to the coaxial cable by which the deflection signal is transmitted to the plates. A stop plate (28) ordinarily prevents the electron beam from reaching its target (30) but has an aperture (26) into which the beam can be momentarily deflected to cause a pulse of beam current to hit the target (30). When an electron-beam pulse is to be generated, one of the plate pairs applies an electric field pulse in which the field changes from its quiescent value, in which it deflects the beam to one side of the aperture (26), to a pulse value, in which it deflects the beam to the other side of the aperture (26), deflecting the beam into the aperture (26) in the process. After the field imposed by the first plate pair reaches its pulse value, the second plate pair applies a field that keeps the beam from passing through the aperture when the field from the first plate pair returns to its normal value.

2 Claims, 3 Drawing Sheets

BEAM-BLANKING APPARATUS FOR STROBOSCOPIC ELECTRON BEAM INSTRUMENTS

This application is a continuation of U.S. patent application Ser. No. 07/240,427, filed Sept. 2, 1988, now abandoned, which was a continuation of U.S. patent application Ser. No. 07/129,859, filed Dec. 4, 1987, now abandoned, which was a continuation of U.S. patent application Ser. No. 06/857,720, filed Mar. 10, 1986, and now abandoned.

BACKGROUND OF THE INVENTION

The present invention is directed to apparatus for blanking electron beams in electron-beam instruments. Its primary, but not exclusive, application is to electron-beam stroboscopy.

The instrument most widely used to observe electrical signals is, of course, the oscilloscope. The user places the tip of an oscilloscope probe on the circuit node to be observed, and the probe signal is amplified and applied to cathode-ray-tube (CRT) deflection plates so that a visual representation of the signal is produced on the CRT screen. As circuits have become miniaturized, however, the conventional method of obtaining the signal—i.e., manual placement of a probe on a node—does not work for some nodes of interest, because the nodes are physically much too small.

The solution to this problem has been electron-beam stroboscopy. An electron-beam stroboscope uses much the same apparatus as an electron microscope does. Specifically, a beam of electrons is focused on a very small region of the object to be studied, in this case an operating integrated circuit. The secondary electrons emitted by the circuit are collected, and a signal representative of the secondary current is produced. In standard electron microscopy, an image is generated from the differences caused in the secondary current by the different physical features that the beam encounters as it is scanned over a region of the object.

In contrast, the electron beam in electron-beam stroboscopy is generated in short pulses whose time of occurrence is determined by reference to a trigger signal that represents a particular time in each cycle of a device under test. The magnitude of the emitted-electron flux depends on the voltage at the point in the device on which the beam is focused, so an image can be generated from the differences caused in the secondary current by the different voltages encountered by different pulses of the electron beam.

There are two major modes of electron-beam stroboscopy. They are distinguished from each other by the different relationships between successive pulses. In the first mode, which results in spacial scanning, successive pulses occur in the same time relationship to successive trigger signals but are deflected by different distances so that they hit different points on the device under test. This mode generates a voltage contour of the region of interest for a particular instant in the cycle of the device.

The second mode results in a plot of voltage versus time for a particular spacial point on the device. In this mode, the deflection remains the same for successive cycles, but each electron-beam pulse is spaced in time from its respective trigger signal by a different delay. In both modes, the electron-beam pulses must last for very short time intervals because high-speed integrated circuits present the need to observe voltages that change very quickly.

These short intervals are difficult to achieve. One of the factors that has limited time resolution in the past has been the degradation ("spreading") of the blanking pulse, the signal that effectively turns the electron beam on and off by deflecting it into and out of an aperture in a beam stop. It is an object of the present invention to reduce blanking-pulse degradation. It is a further object of the present invention to increase time resolution in electron-beam instruments.

SUMMARY OF THE INVENTION

Certain of the foregoing and related objects are achieved in an apparatus in which two sets of deflection plates are disposed between an electron source and a stop plate. The stop plate is in turn disposed between the electron source and a test point that is to be hit by the electrons, and an aperture is provided in the stop plate to permit the electrons to pass through it and reach the test point. One of the sets of plates is driven by a signal whose quiescent value is such as to deflect the beam to one side of the aperture so that the stop plate stops the beam and thus prevents the beam from reaching the test point. On the occurrence of a pulse, that signal changes to a level that deflects the beam to the other side of the aperture. In doing so, however, that signal passes through values that permit the beam to pass through the aperture. Thus, the duration of the pulse of current hitting the test point is determined by the rise time of the pulse.

The other set of stop plates is oriented at an angle, typically a right angle, to the first set, and it is driven by a second signal whose quiescent value allows the beam to pass through the aperture when the beam is permitted to do so by the field set up by the first set of plates.

BRIEF DESCRIPTION OF THE DRAWINGS

Further features and advantages of the present invention are described below in connection with the accompanying drawings, in which.

DETAILED DESCRIPTION OF THE PREFERRED EMBODIMENTS

Figure 1:
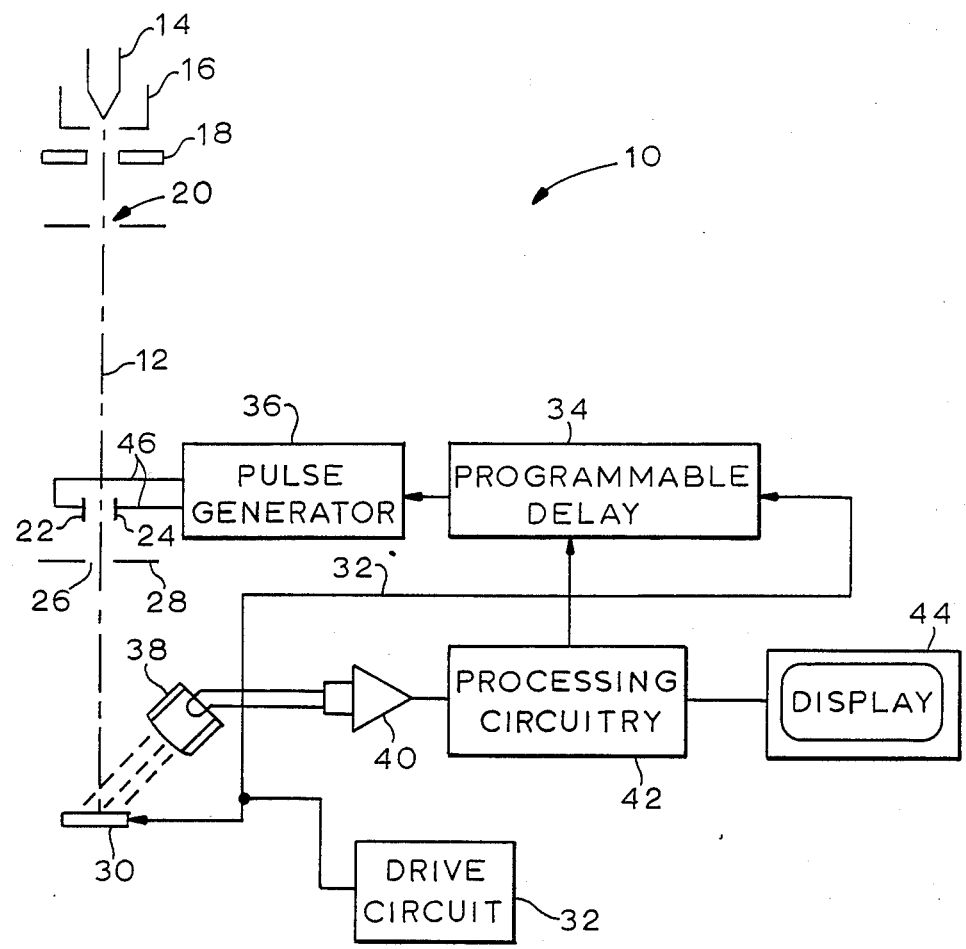
FIG. 1 is a diagram of an electron-beam stroboscope of the type in which the present invention can be practiced.

FIG. 1 depicts in greatly simplified form the basic components of an electron-beam stroboscope 10. A beam of electrons, represented by center line 12, is generated in a known manner by a controllable source comprising a cathode 14, a Wehnelt cylinder 16, and an anode 18. The electron beam 12 passes through a spray aperture 20 and between blanking plates 22 and 24. Unless deflected by electric field imposed by the blanking plates 22 and 24, the beam 12 passes through an aperture 26 in a beam stop 28 and hits a desired point in an operating device under test ("DUT") 30, typically an integrated circuit.

A drive circuit 32 applies to the DUT 30 all timing, life-support, and input signals needed to cause operation of the node of interest in repeated, identical cycles. A timing signal representing a predetermined point in each cycle is also applied, by way of a signal line 33, to a programmable delay line 34, whose output triggers a pulse generator 36 to apply a short-duration pulse to plates 22 and 24. Application of the pulse removes an electric field that ordinarily deflects the electron beam 12, so the beam passes through aperture 26 and hits the node of interest for a very short time. At all other times, the beam stop 28 prevents the electrons from reaching the DUT 30.

When the electron beam 12 hits the DUT 30, it causes emission of secondary electrons, which are collected by a secondary-electron collector 38. The resultant current depends on the voltage that is present at the observed node at a point in the DUT cycle determined by the programmable delay 34. This current is amplified by a photomultiplier-tube amplifier 40, and processing circuitry 42 receives the resultant signal. The processing circuitry 42 varies the delay of the programmable delay line 34 so that the photomultiplier-tube output that it receives results from node voltages that occur at different times within the cycle. In this way, the processing circuitry 42 is able to form a plot of the signal at the observed node as a function of time and display it on a suitable display, such as a cathode-ray tube 44. (This is the temporal-scanning mode. The spatial-scanning mode will not be separately described, since the applicability of the present invention to spatial scanning will be evident in light of its description in the context of temporal scanning.)

In order to insure that the pulses applied to the deflection plates 22 and 24 retain the pulse shape of which the pulse generator 36 is capable, the characteristic impedance of the transmission line 46 by which the pulse generator 36 transmits its output to the plates 22 and 24 should nearly equal the output impedance of the pulse generator 36. In accordance with the present invention, preservation of pulse shape is further enhanced by the arrangement of the plates themselves, as FIGS. 2-5 illustrate.

Figure 2:
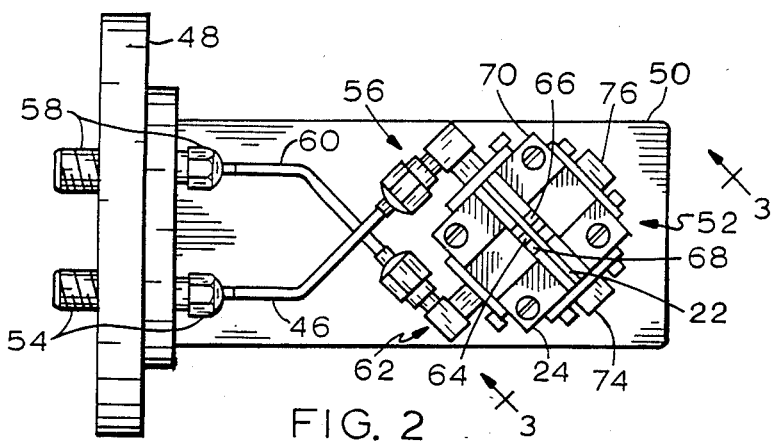
FIG. 2 is a plan view of a portion of the beam blanker of the present invention showing the blanking plates.

FIG. 2 is a plan view of the portion of the stroboscope that provides the blanking plates 22 and 24. A mounting plate 48 is mounted in an aperture in the housing that acts as the barrier between the exterior atmosphere and the vacuum in which the electron beam is produced. A bracket 50 is secured to it and acts as a support for a plate assembly 52, which includes the deflection plates 22 and 24. As that drawing shows, plate 22 is in the form of a thin plate, while "plate" 24 is actually in the form of a thick block. Air-tight feed-through fittings 54 of a conventional type provide a connection between the part of the transmission line 46 within the housing and the part (not shown) that leads to the pulse generator 36 outside the housing. A coaxial-to-stripline coupler 56 couples the pulse from the coaxial transmission line 46 to the deflection plates 22 and 24, which, as will be seen presently, are in a stripline configuration to maintain a uniform characteristic impedance. Fitting 54 and coupler 56 are commercially available items and are chosen to match the characteristic impedances of the components to which they connect.

Although only one set of plates 22 and 24 is depicted in the simplified diagram of FIG. 1, the present invention can advantageously be practiced with two sets of plates oriented at right angles to each other, and FIGS. 2-5 illustrate such an arrangement. For the second set of plates, further fittings 58 are provided in the mounting plate 48 to join the parts of a second transmission line 60, which is coupled by a second coupler 62 to the second set of plates 64 and 66. Like plate 22, plate 64 is in the form of a thin plate, while plate 66 is in the form of a thicker block like plate 24.

Figure 3:
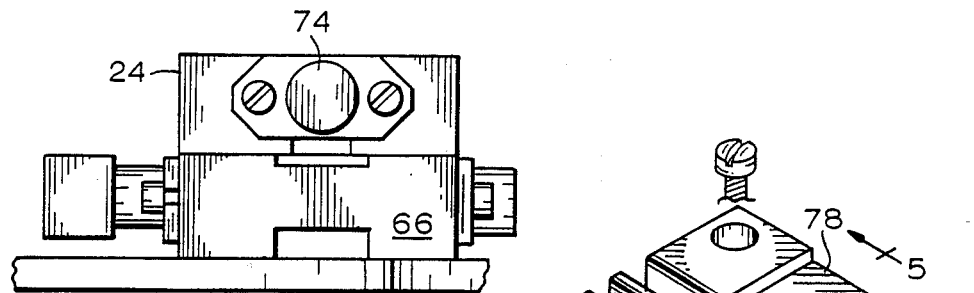
FIG. 3 is a vertical elevation of the plate assembly of the beam blanker of FIG. 2 taken at line 3—3 of FIG. 2.
Figure 4:
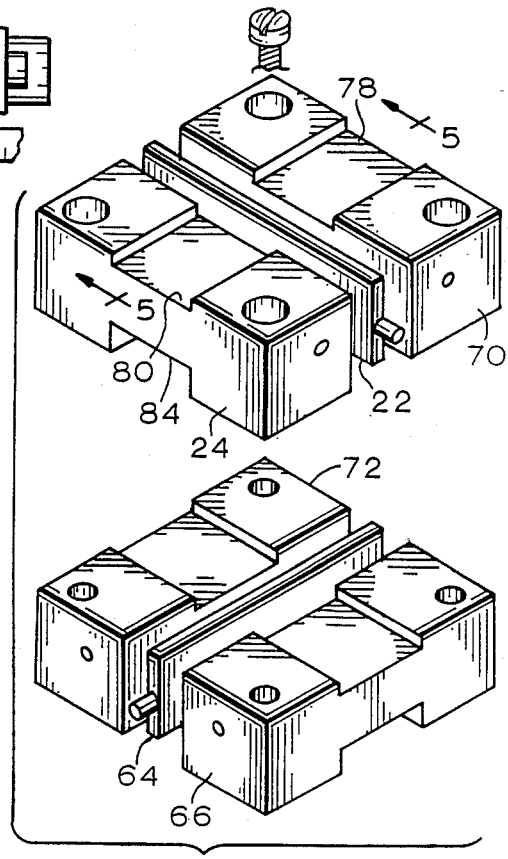
FIG. 4 is an exploded view of the assembly of FIG. 3.

As is best seen in FIGS. 3 and 4, the second set of plates 64 and 66 is disposed below the first set set of plates 22 and 24. FIG. 2 shows that the four deflection plates 22, 24, 64, and 66 define a pathway 68 through which the electron beam 12 passes, and an opening (not shown) in the bracket 50 is aligned with the pathway 68 to permit the beam to pass through it.

FIG. 4 shows that, in addition to the four deflection plates 22, 24, 64, and 66, the plate assembly includes blocks 70 and 72, which are complementary to the block-shaped deflection plates plates 24 and 66, respectively, and disposed on the other sides of plates 22 and 64 from them. The outer conductors of coaxial transmission lines 46 and 60 are connected by the couplers 56 and 62 to the complementary blocks 24 and 70 and 66 and 72, respectively, while the center conductors are connected to plates 22 and 64, respectively. This constitutes a stripline configuration, which results in less loss to radiation than would a configuration consisting simply of a pair of deflection plates.

Furthermore, a stripline configuration, with a proper selection of dimensions, can be made to have the same characteristic impedance as the coaxial cables 46 and 60. The coaxial cables, together with the stripline arrangement, can therefore form a composite transmission line that has a substantially uniform characteristic impedance. That is, the deflector plates, instead of being a capacitive load on the transmission line, merely form an extension of it. To complete the paths, the striplines are terminated in commercially available stripline terminators 74 and 76 whose resistances equal the characteristic impedances of the striplines that they terminate.

Figure 5:
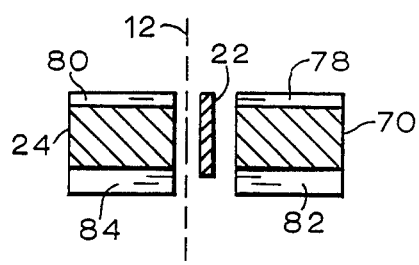
FIG. 5 is a vertical cross section taken at line 5—5 of FIG. 4 showing the stripline characteristics of the blanking plates.

As can best be seen in FIG. 5, relieved areas 78, 80, 82, and 84 are provided in the ground-plane elements 24 and 70 of the upper stripeline. Similar areas are provided in the lower stripline. These relieved areas reduce the thicknesses of the ground-plane elements and thus reduce the length of time during which the electrons are under the influence of the deflecting field. This limits the smearing effects of deflection-voltage transitions.

The blanking operation can be performed with a single set of plates, as was briefly described in connection with FIG. 1. For single-set operation, the voltage on the plates during most of a cycle is such as to prevent the electron beam 12 from passing through the aperture 26 in the beam stop. Then, when the pulse occurs, it permits passage of the beam 12 through the aperture for the duration of the pulse. The time resolution in such a system is thus limited by the minimum pulse duration of available pulse generators.

Figure 6:
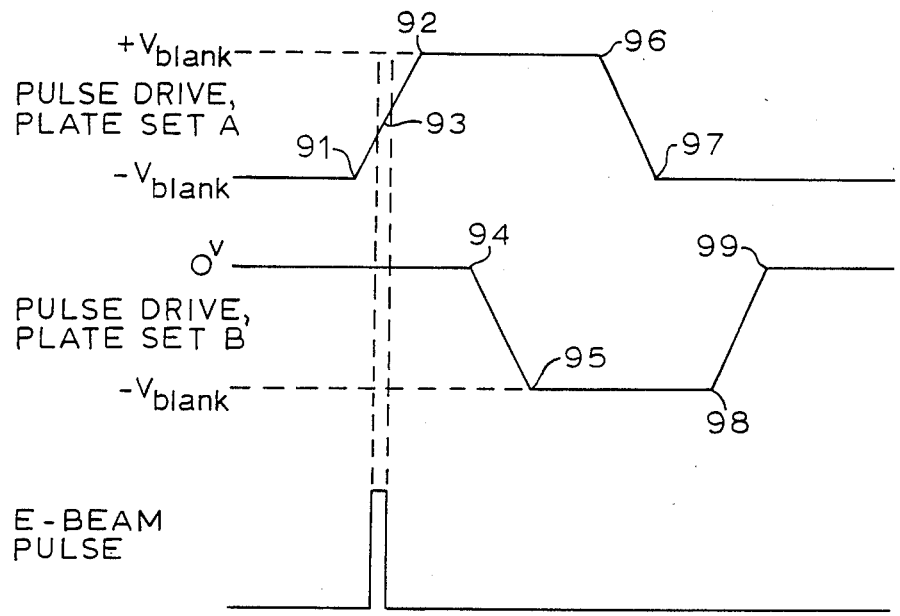
FIG. 6 is a timing diagram of the blanking pulses used for the four-plate embodiment of the present invention.

The two-set version provides even greater time resolution. In this version, the pulse generator 36 generates pulses for the second set of plates 64 and 66 as well as for the first. The pulses for the second set are delayed by a fixed interval from the pulses for the first set but overlap them, as FIG. 6 illustrates. The line labeled "Pulse Drive Plate Set A" depicts the short-duration pulse that the pulse generator applies to plates 22 and 24. Unlike the pulse applied in the one-set arrangement, however, the transition in the pulse applied to plates 22 and 24 in the two-set arrangement is between two voltages ("$-V_{blank}$" and "$+V_{blank}$") that prevent the beam from reaching the DUT. In the course of the transition, however, the plate voltage passes through a voltage that permits the beam to reach the DUT. Thus, the duration of the resultant electron-beam pulse that the DUT experiences is much less than that of the pulse applied to the plates, as the "E-Beam Pulse" line of FIG. 6 illustrates. In fact, the duration of the electron-beam pulse is not dependent so much on the plate-pulse duration as on its rise time and amplitude; a fast-rising pulse will produce a short-duration electron beam, while a pulse that rises more gradually produces a longer-duration electron beam.

The second set of plates 64 and 66 is used to prevent an electron-beam pulse from occurring on the trailing edge of the plate pulse. The signal applied to the second plate set is represented in the FIG. 6 by the line labeled "Pulse Drive Plate Set B." As that line indicates, this pulse is delayed somewhat from the first-set pulse, but it overlaps that pulse. The leading edge of the second-set pulse is a transition from a potential difference of zero to a potential difference of $-V_{blank}$. The zero potential difference allows the electron beam 12 to pass through the beam-stop aperture in the absence of a deflecting voltage from the first plate set, while the $-V_{blank}$ voltage prevents the beam from doing so.

Figure 7:
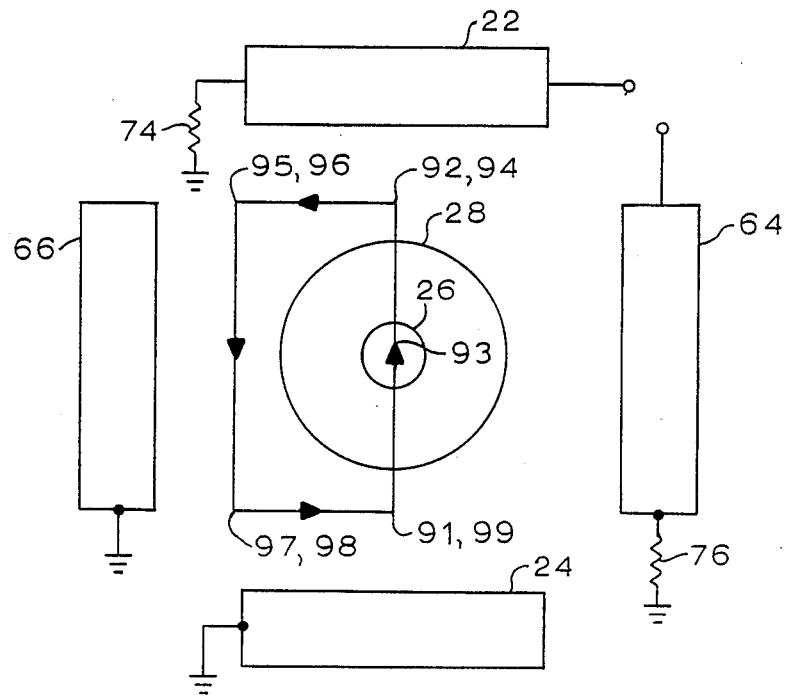
FIG. 7 is a diagram of the beam deflection for the four-plate embodiment of the present invention.

The manner in which the two plates work together is depicted in FIG. 7, which is a diagrammatic plan view looking down through the plates to the beam-stop aperture 26. In the absence of both pulses, the electron beam is in the position indicated by reference numeral 91, i.e., outside of the beam-stop aperture 26. On the leading edge of the first pulse, the beam moves from point 91 to point 92, moving through a point 93 in the aperture. The corresponding points in the pulse-generator output are marked with corresponding reference numerals in FIG. 6. The beam hits the DUT only for the short time during which the beam is in the aperture 26.

On the leading edge of the second pulse—i.e., during the transition between the points marked 94 and 95 in FIG. 6—the beam moves from the point labeled 92, 94 in FIG. 7 to the point labeled 95, 96. The two reference numerals refer to correspondingly numbered points on the first two signal plots in FIG. 6. Subsequently, the trailing edge of the first pulse occurs, between the points labeled 96 and 97 in FIG. 6. Although the first-pulse voltage passes through the values that permitted the electron beam to pass through the aperture 26 on the leading edge, the electric field that is now produced by the second plate set prevents the beam from passing through it on the trailing edge. Thereafter, the trailing edge of the second plate set occurs, and the beam is deflected from point 97, 98 to point 91, 99. The signals for both plate sets have thereby returned to their quiescent values, where they remain until the next pulses occur.

By means of this arrangement, the time resolution for electron-beam stroboscopy is improved. The blanking pulses are not degraded by reflections, and they are limited only by the rise times of the blanking pulses and not by their durations. The present invention thus constitutes a significant advance in the art.

What is claimed as new and desired to be secured by Letters Patent of the United States is:

1. For determining the voltage on a node in a circuit at predetermined points in the cycle of operation of the circuit, an apparatus comprising:
  A. a source of electrons;
  B. means for driving the electrons along an electron path from the source to a test point on a circuit under test disposed in a target region;
  C. a stop plate between the source and the target region, the stop plate forming a beam-limiting aperture for passage therethrough of electrons passing from the source to the target region;
  D. a transmission line having a substantially uniform characteristic impedance and being terminated at one end in that characteristic impedance, the transmission line including a coaxial section, a stripline section, and a coaxial-to-stripline coupler coupling the coaxial section to the stripline section, the center conductor and one of the outer conductors of the stripline section forming a pair of deflection plates disposed on opposite sides of the electron path between the source and the target region to permit electrons passing from the source to the target region to pass therebetween and be deflected by any electric field therebetween;
  E. a pulse generator, connected to the other end of the transmission line and adapted to receive a trigger signal that occurs at a predetermined point in the cycle of operation of a device under test, for generating a voltage pulse at a time determined by the trigger signal, the voltage applied by the pulse generator during a pulse being such that the electric field between the plates permits the electron beam to pass through the aperture in the stop plate and thereby hit the target region, the voltage applied by the pulse generator between pulses being such that the electric field between the plates prevents the electron beam from passing through the aperture in the stop plate and thereby from reaching the target; and
  F. means for collecting electrons emitted from an object in the target region, generating an indication of the rate of electron emission from the object, and thereby indicating the voltage at the test point.

2. For determining the voltage at a test point in a circuit under test, an apparatus comprising:
  A. a source of electrons;
  B. means for driving the electrons along an electron path from the source to a test point on a circuit under test disposed in a target region;
  C. a stop plate interposed between the source and the target region, the stop plate forming a beam-limiting aperture for permitting electrons directed at the aperture to pass therethrough and reach the target region and for preventing electrons not directed at the aperture from reaching the target region;
  D. a first transmission line having a substantially uniform characteristic impedance and being terminated at one end in that characteristic impedance, the first transmission line including a first coaxial section, a first stripline section, and a first coaxial-to-stripline coupler coupling the first coaxial section to the first stripline section, the center conductor and one of the outer conductors of the first stripline section forming a first pair of deflection plates disposed on opposite sides of the electron path between the source and the target region to permit electrons passing from the source to the target region to pass therethrough and be deflected by any electric field therebetween;

E. a second transmission line having a substantially uniform characteristic impedance and being terminated at one end in that characteristic impedance, the second transmission line including a second coaxial section, a second stripline section, and a second coaxial-to-stripline coupler coupling the second coaxial section to the second stripline section, the center conductor and one of the other conductors of the second stripline section forming a second pair of deflection plates disposed on opposite sides of the electron path at an angle to the first pair of deflection plates between the source and the target region to prevent electrons passing from the source and the target region to pass between the second pair of deflection plates and be deflected by any electric field therebetween;

F. pulse-generation means, connected to the other end of the first and second transmission lines, for:
  i. generating and applying to the first and second pairs of deflection plates first and second deflection signals, respectively, the first deflection signal normally assuming a first quiescent level, at which the resultant electric field between the deflection plates of the first pair results in the beam's hitting the stop plate on one side of the aperture when the second deflection signal is at a second quiescent level;
  ii. generating in the first deflection signal a first pulse, in which the first deflection signal passes (a) from the fist quiescent level, (b) through an intermediate level, at which the resultant electric field between the deflection plates of the first pair results in a beam's passing through the aperture to reach the target region when the second deflection signal is at the second quiescent level, (c) to a first pulse level, at which the resultant electric field between the deflection plates of the first pair results in the beam's hitting the stop plate on the opposite side of the aperture when the second deflection signal is at the second quiescent level, and (d) back through the intermediate level to the first quiescent level;
  iii. generating in the second deflection signal a second pulse, in which the second deflection signal passes (a) from the second quiescent level (b) to a second pulse level, at which the resultant electric field between the deflection plates of the second pair results in the beam's hitting the stop plate regardless of the level of the first deflection signal, and (c) back to the second quiescent level, and;
  iv. overlapping the first and second pulses in time so as to cause the second deflection signal to pass to the second pulse level after the first pulse signal has passed through the intermediate level for the first time but before it is has passed through the intermediate level for the second time and so as further to cause the second deflection signal to pass from the second pulse level to the second quiescent level after the first deflection signal has passed through the intermediate level for the second time, whereby the duration of the electron-beam exposure experienced by a circuit disposed in the target region can both be less than that of the first pulse and less than that of the second pulse.

* * * * *